United States Patent [19]

White, Jr. et al.

[11] Patent Number: 4,642,784
[45] Date of Patent: Feb. 10, 1987

[54] INTEGRATED CIRCUIT MANUFACTURE

[75] Inventors: Lionel S. White, Jr.; Maury Zivitz, both of Houston, Tex.

[73] Assignee: Texas Instruments Incorporated, Dallas, Tex.

[21] Appl. No.: 604,115

[22] Filed: Apr. 26, 1984

[51] Int. Cl.⁴ ............................................. G06F 11/00
[52] U.S. Cl. .................... 364/551; 364/580; 371/26
[58] Field of Search ............... 364/579, 580, 551, 300; 371/20, 25, 26

[56] References Cited

U.S. PATENT DOCUMENTS 4,168,527 9/1979 Winkler ............................... 364/580
4,484,329 11/1984 Slamka et al. ..................... 371/26 X

OTHER PUBLICATIONS

"Automated Analysis of Dynamic RAM Functional Failures", Kuban & Holmes 1980 IEEE Test Conference, Paper 9.1, pp. 221–224.
"Pattern Recognition of Bit Fail Maps", Faucher, 1983 IEEE Test Conference, Paper 16.1, pp. 460–463.

Primary Examiner—Edward J. Wise
Attorney, Agent, or Firm—John G. Graham; Rodney M. Anderson

[57] ABSTRACT

Proven data base is generated for electrical test responses of sporadic defects in integrated circuits as manufactured. Manufactured circuits are subjected to that electrical testing and resulting responses used to identify defect and check the manufacture to avoid its repetition.

24 Claims, 6 Drawing Figures

INTEGRATED CIRCUIT MANUFACTURE

The present invention relates to the manufacture of integrated circuits, more particularly such circuits which are likely to sporadically contain manufacturing defects that are not detectable visually or require excessively long visual inspection to detect.

Among the objects of the present invention is an improved manufacturing method that effectively treats the foregoing difficulty.

Additional objects of the present invention will be apparent from the following description of several of its exemplifications, reference being made to the accompanying drawings wherein.

Figure 1:
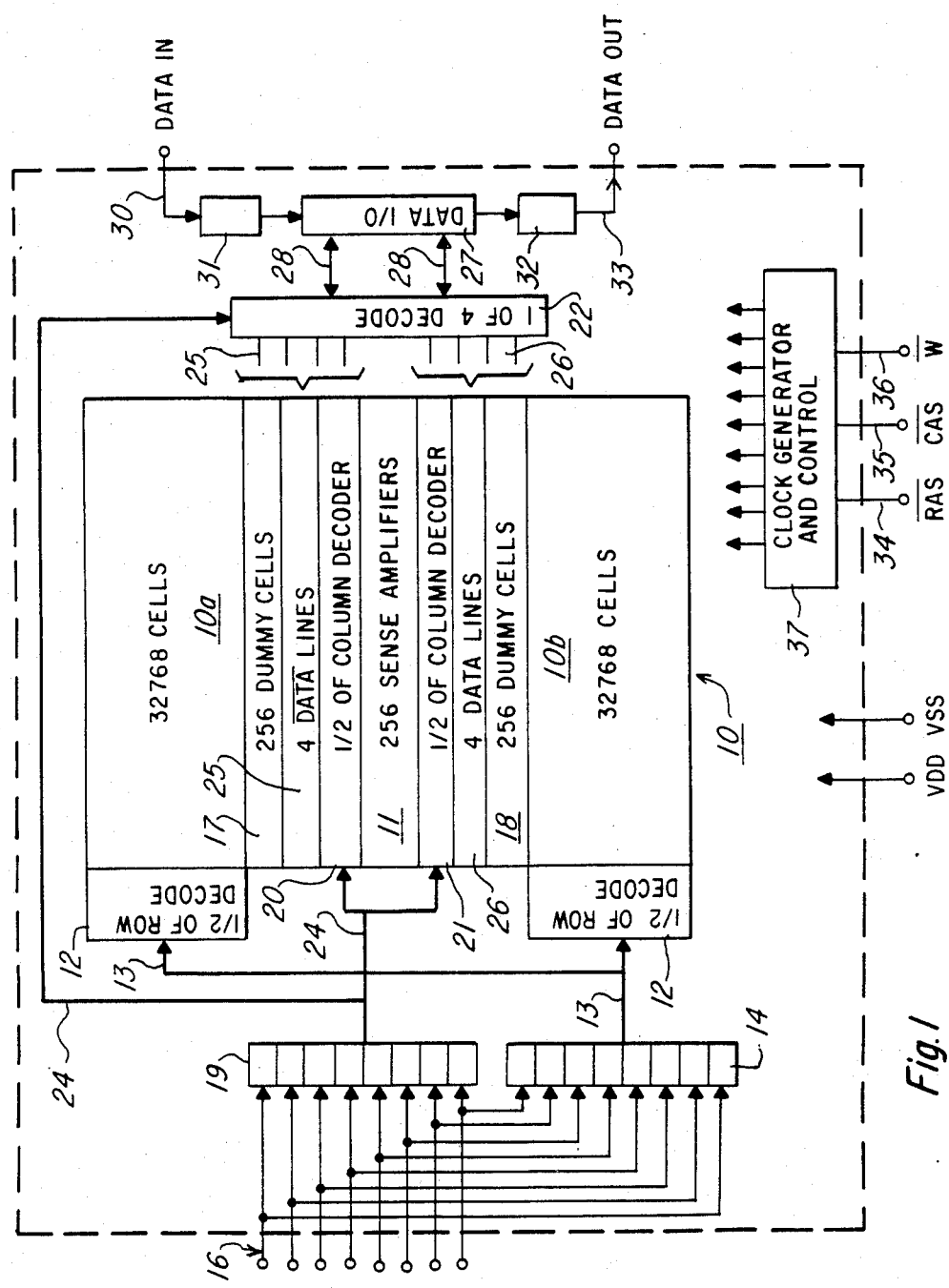
FIG. 1 is an electrical diagram in block form of a semiconductor dynamic memory device of the type upon which the testing method of the invention may be practiced.

Integrated circuits are being manufactured with increasingly higher component density, up to the one-million bit level, and smaller circuit components, down to a few microns or less in maximum dimension; such increase in component count and reduction in size has put a heavy strain on the testing of the resulting products. The processes used in making these VLSI devices provide a manufacturing yeild of less than 100%. Considerable effort is expended to improve the yield, and this effort includes, in addition to electrical testing, the visual inspection of chips that do not pass the electrical tests, for the purpose of determining the exact cause of failure so that the manufacturing process can be modified to increase the yield. This visual inspection is done by means of very high power microscopes which necessarily have a limited field of view; the time required to scan every cell of every chip on an entire slice can be quite long, many hours. Even so, some defects are not visable.

No matter how carefully protected the integrated circuit manufacturing facility is, it appears impossible to completely avoid sporadic defects of the type caused by particulates, particularly as the circuit elements become smaller and smaller in size. Thus circuit components are in many cases now manufactured so that an individual one occupies a space no greater than a few square microns on the surface of an integrated circuit substrate, and individual lines of electrodes only one or two microns in width. With such dimensions there is a finite probability that a particle from the ambient, e.g., an invisible speck of dust, will find its way into a position on the slice during the process steps so that the manufactured product is rendered useless.

The manufacturing process employs a sequence of depositions, photolithographic steps using masks, etch steps, ion implants, and the like to create the various layers. It is important to pinpoint exactly which layer and which step is causing faults. Particulates could be a main cause of faults at a given step, or the variables of the process step itself could be the cause—that is, an etch step may be inadequate or excessive.

According to the present invention, manufactured integrated circuits that may sporadically contain manufacturing defects not detectable visually or requiring excessively long visual inspection to detect, are tested by generating a proven data base showing the responses caused by specific defects of the foregoing types to an electrical test signal sequence, applying the test signal sequence to a manufactured integrated circuit, and when a defect is thus detected and identified, checking the manufacturing conditions at the stage identifed to specifically correct the process and avoid the defect.

For the purpose of illustrating failure patterns which may be used for defect analysis according to the invention, an example of a specific semiconductor memory device will be given, it being understood that the concepts of the invention can be used with other semiconductor devices or like electrical arrays.

A 64K-bit dynamic RAM is shown in block diagram form in FIG. 1. This device is commercially available from Texas Instruments as part number TMS4164, and is described in the Sept. 28, 1978 issue of Electronics magazine, at pp. 109-116. Also, the device is described in detail in U.S. Pat. No. 4,239,993, issued to McAlexander, White & Rao, assigned to Texas Instruments. Since the selected failure patterns used in defect analysis according to the invention are dependent upon the specific circuitry and geometry of the device, the structural details of this example device need be examined.

Referring to FIG. 1, the memory device which is used as an example is a random access, read/write memory of the dynamic type, made by an N-channel, self-aligned, silicon gate MOS process. All of the memory device of FIG. 1 is included in one silicon chip of about 1/30 of a square inch in size which is finished form would be mounted in a standard dual-in-line package having sixteen pins or terminals. The device includes in this example an array 10 of 65,536 memory cells, with the array split into two halves 10a and 10b of 32,768 cells each, in a regular pattern of 256 rows and 256 columns. Of the 256 row or X lines, there are 128 in the array half 10a and 128 in the half 10b. The 256 column or Y lines are each split in half with one half being in each of the halves 10a and 10b. There are 256 sense amplifiers 11 in the center of the array; these are differential type bistable circuits according to U.S. Pat. No. 4,239,993, and each one is connected in the center of a column line. Thus 128 memory cells are connected to each side of each sense amplifier by a column line half or "bit line". The chip requires only a single +5 v supply Vdd, along with a ground terminal Vss.

A row of X address decoder 12, split into two halves, receives address and address-bar inputs by sixteen lines 13 from eight address buffers or latches 14. An eight-bit X address is applied to inputs of the address buffers 14 by eight address input terminals 16. The X decoder 12 functions to select one of the 256 row lines as defined by an eight bit address applied to the input terminals 16; if the selected row line is in the half 10b of the cell array then a row of dummy cells 17 on the opposite side of the sense amplifiers 11 is also activated, while if a line in the half 10a is selected then a row of dummy cells 18 is activated. The address signals on the input lines 16 are time multiplexed; the Y address is also applied to these input lines and is latched into a set of eight buffers 19, from which it is applied to column decoders 20, 21 and 22 via lines 24. A one-of-64 selection is made by the column decoders 20 and 21, so that one group of four columns is connected to sets of four data and data-bar lines 25 and 26, based on six bits of the eight bit Y address. A one-of-four decoder 22 selects one pair of the four pairs of lines 25 and 26, based on two bits of the eight bit Y address, and connects the selected pair to a data I/O control circuit 27 via a pair of data/data-bar lines 28. A single-bit data input is applied by an input terminal 30 to a data input latch 31, and the output of this latch is coupled to the data I/O control 27. One-bit data output is connected from the data I/O control 27 through a buffer 32 to a data out terminal 33.

Figure 2:
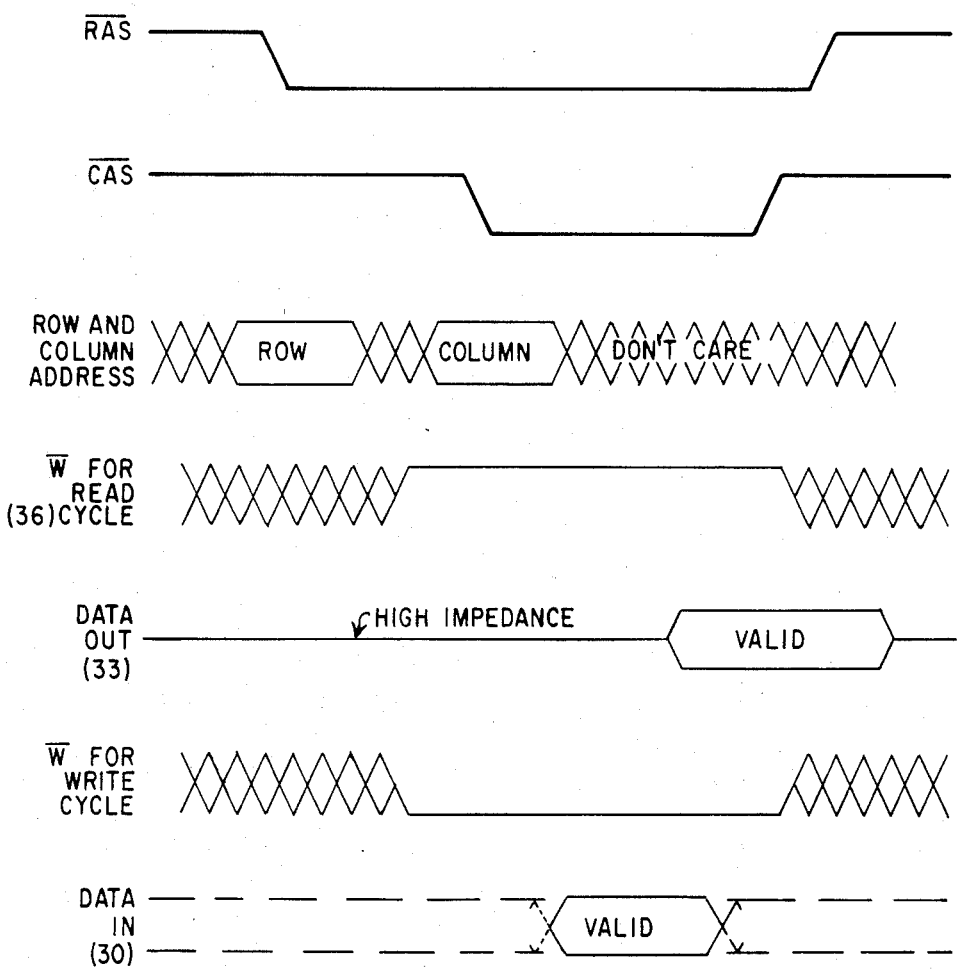
FIG. 2 is a graphic representation of voltage vs time, or other conditions vs. time, existing for various parts of the device of FIG. 1.

Referring to FIGS. 1 and 2, the X address must appear on the inputs 16 when a row address strobe signal, referred to as $\overline{RAS}$, is applied to an input 34. Likewise, the Y address must appear during a column address strobe signal $\overline{CAS}$ on an input 35. A read/write control R/$\overline{W}$ on an input 36 is the other control signal for the device. These three inputs are applied to clock generator and control circuitry 37 which generates a number of clocks and control signals to define the internal operation of various parts of the device. When $\overline{RAS}$ goes low as seen in FIG. 2, clocks derived from $\overline{RAS}$ cause the buffer 14 to accept and latch the eight bits when appearing on the input lines 16. When $\overline{CAS}$ goes low then clocks generated in the circuitry 37 cause the buffers 19 to latch the Y address then appearing on the inputs 16. Thus the row and column addresses must be valid during the time periods shown. For a read cycle, the R/$\overline{W}$ signal on input 36 is held high during the period when RAS falls, and the output on the terminal 33 will be valid during the time period illustrated. For a write cycle, the R/W signal must be low and the data-in bit must be valid during the time indicated in FIG. 2.

Figure 3:
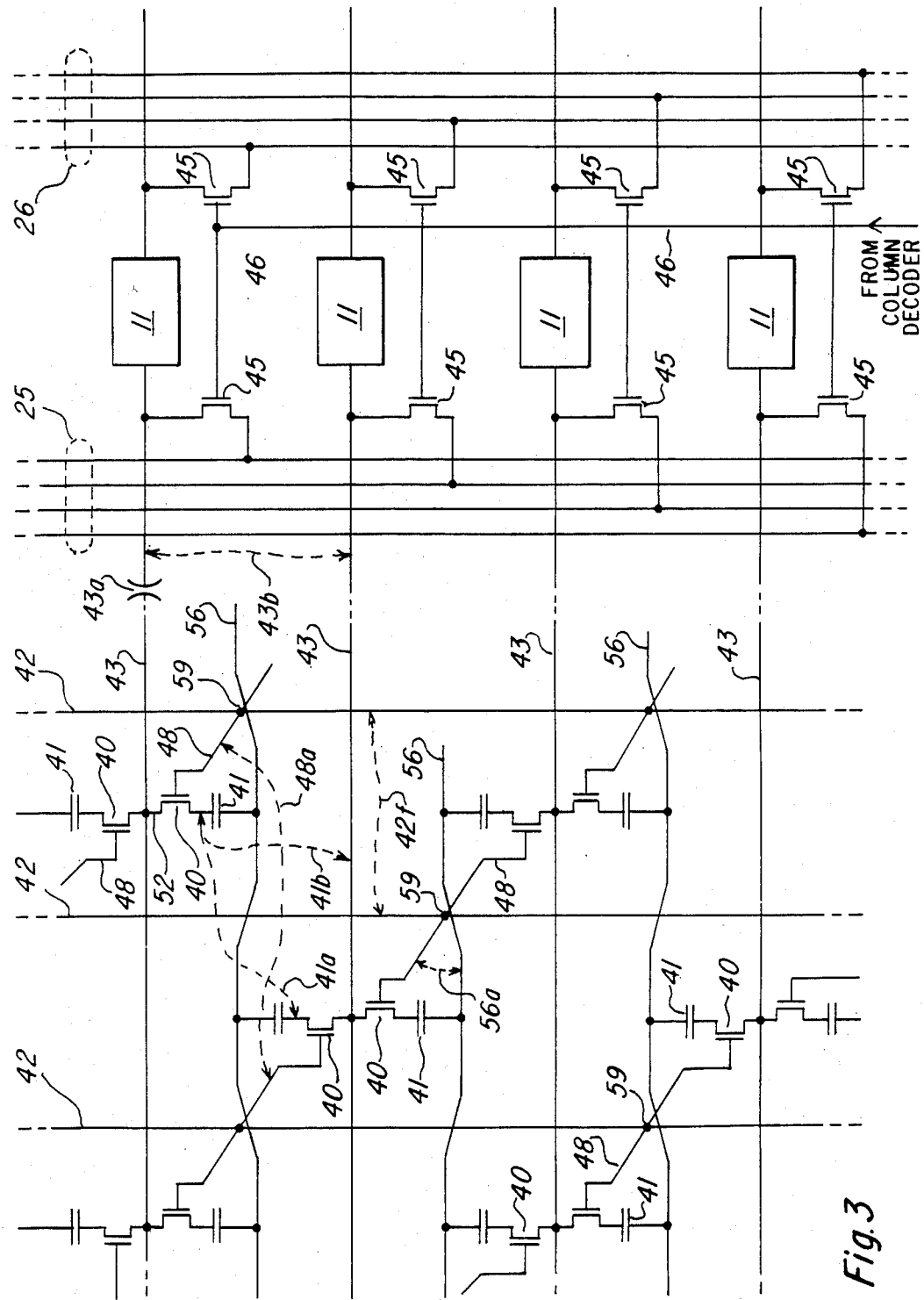
FIG. 3 is an electrical schematic diagram of a part of the device of FIG. 1 showing a representation of part of the cell array and sense amplifier circuitry in detail.

In FIG. 3, a portion of the cell array 10a and 10b is shown in schematic form. The cells consist of access transistors 40 and storage capacitors 41, with the gates of access transistors being connected to row lines 42. The sense amplifiers 11 positioned at the center of the array are connected to bit lines 43, two opposite bit lines 43 defining a column of 256 cells. The sense amplifiers 11 and columns are in groups of four, only one group being shown. Sixty-three other sets of four sense amplifiers and column lines are included in the array. Connected to each bit line 43 are 128 of the one-transistor cells having a transistor 40 and a capacitor 41. Each row line 42 is connected to the gates of all of the 256 transistors 40 in a row; there are 256 identical row lines 42 in the array.

The data and data-bar I/O lines 25 and 26 extend on each side of the sense amplifiers 11, and are connected to the bit lines by transistors 45. The column decoders 20, 21 produce outputs to the gates of the transistors 45 based on the column address; six bits of the column address select 4-of-256 columns at a given time, so a line 46 at the column decoder output is connected to all eight of the transistors 45 for a group of four sense amplifiers.

Figure 4:
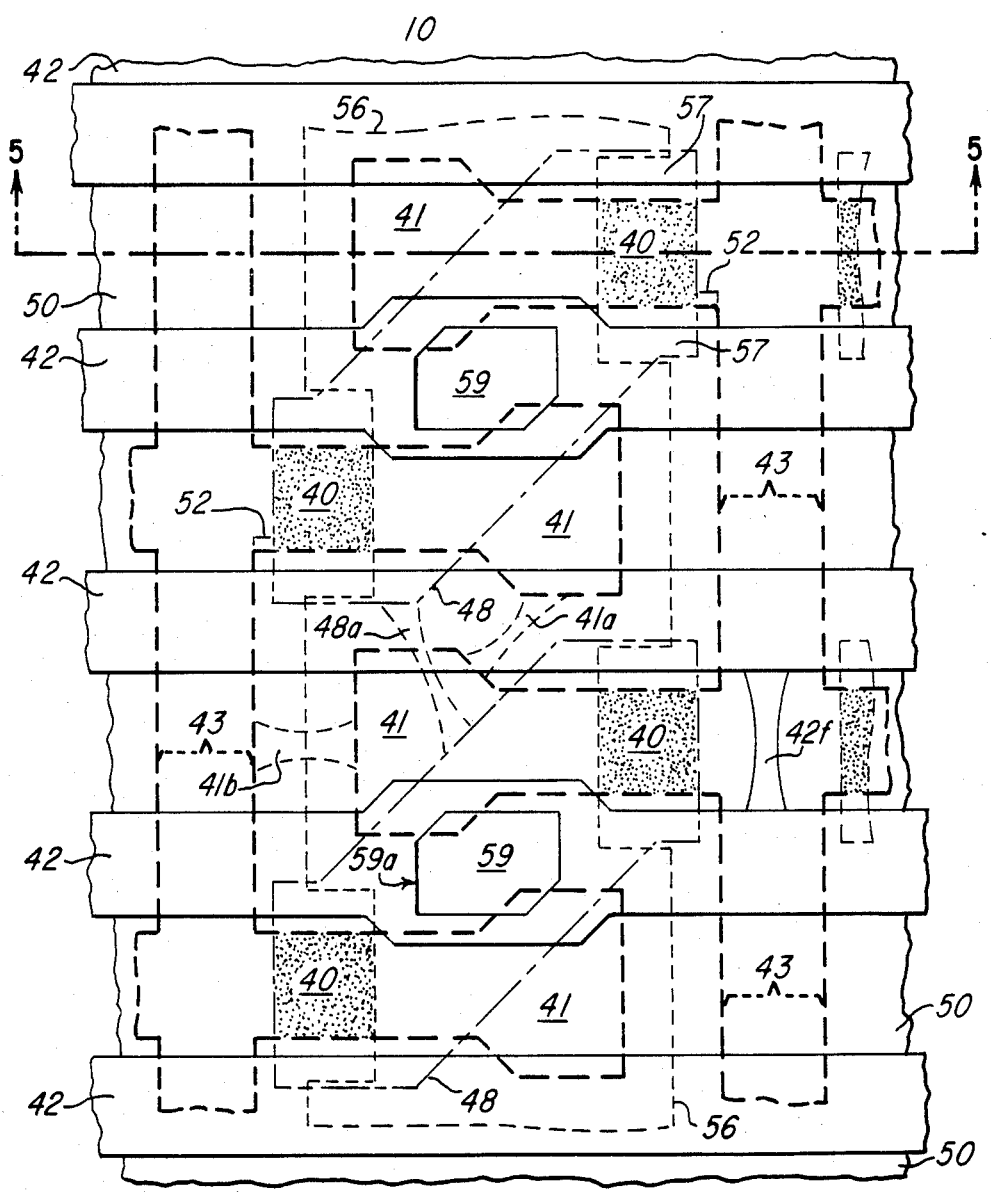
FIG. 4 is a plan view of a portion of the cell array of FIGS. 1 and 3 showing the complexity which permits defects to sporadically appear during its manufacture.
Figure 5:
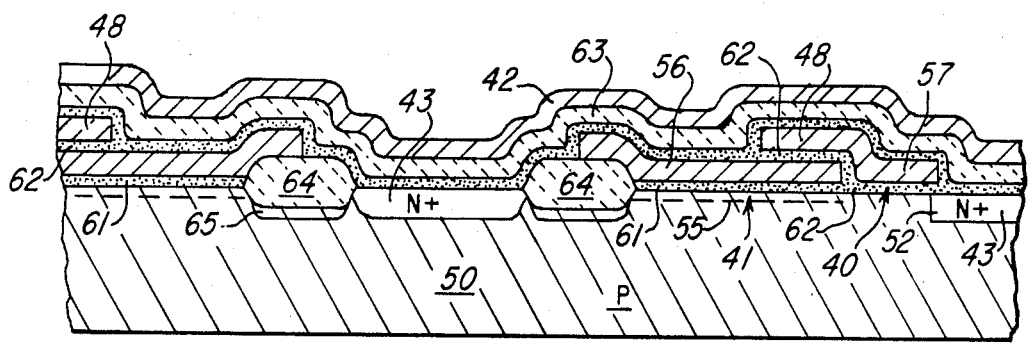
FIG. 5 is a sectional view taken along line 5—5 of the construction of FIG. 1.

FIGS. 4 and 5 show a small portion of the cell array of the 64K dynamic random access memory (DRAM) of FIGS. 1 and 3. The memory cells, each composed of an MOS access transistor 40 and an adjacent MOS storage capacitor 41, are shown formed in a silicon substrate 50. Each access transistor has an N+ source (or drain) region 52 which is part of one of the elongated bit lines 43 formed by N+ implanted regions in the face of the silicon substrate 50. The capacitors 41 include inverted regions 55 in the surface of the silicon created by a Vcc voltage, about 5 v, applied to elongated first-level polycrystalline silicon strips 56 which extend between the bit lines 43, over top of a thin silicon oxide coating 61. The gates 57 of the access transistors 40 are formed by second-level polycrystalline silicon segments 48, each of which forms gates for two adjacent transistors. The segments 48 extend over the first-level polysilicon, with a silicon oxide layer 62 between them to provide contact areas 59 where connection is made to metal row or word lines 42. Each contact area 59 is shared by two cells.

The silicon oxide coating 62 separates the gates 57 from the silicon of substrate 50 at the transistors 40 (providing gate oxide) as well as separating the remainder of the second-level poly segments 58 from the first level poly. A thick layer 63 of deposited oxide separates the polysilicon layers from the metal lines 42. Another thick layer of thermal silicon oxide 64 surrounds all of the moat areas of the fae of the silicon substrate; that is, all areas not occupied by the transistors 40, capacitors 41 and bit lines 43 are covered by this field oxide 64. Channel stop regions 65 underlie all of the field oxide. A further description of such a memory device and the process for making it is contained in U.S. Pat. No. 4,388,121 granted June 14, 1983 to G. R. Mohan Rao, assigned to Texas Instruments.

For the purpose of the method of this invention, the device for FIGS. 1 and 3-5 is preferably tested while in slice form rather than after packaging. A four inch slice of silicon would contain hundreds of the semiconductor bars or chips of FIGS. 1 and 3-5, before being scribed and broken into individual chips. The slice is placed on a test chuck at a probe station, and electrical probes brought down upon the metal bonding pads on one chip at a time; these pads represent the control, address, data, and supply terminals 16, 30, 34-36 of FIG. 1. A test machine of the type commercially available is connected to the probes, so that addresses, data-in, controls (R/$\overline{W}$, $\overline{RAS}$, $\overline{CAS}$) can be applied, and data-out measured, as is standard practice. The test machine is in essence a computer which has a stored program, a data memory, and a CPU, so that address and data sequences can be applied for writes, and read can be compared, for pass/fail detection, and indication. For this invention, however, ample memory capacity may be provided for storing all of the pass/fail states for each bit for a number of different sequences. All of this data representing pass/fail states can be transmitted to large scale general purpose data processing equipment for analysis of pass-/fail microstate patterns, i.e., correlation with known patterns, or this could be done in the test machine. Data for devices having no failing bits is obviously of no interest for the purposes of this invention, and also data for devices having large areas of failing bits of overlapping failures will probably be too complex for analysis, and thus this data is not used. The most useful data is for failures affecting a single bit or single row, or a few adjacent bits, rows, or columns, or an intersection of row and column.

Commercially available test machines for RAMs are programmed to conduct a large number of different tests to determine whether or not an individual DRAM meets all of the electrical specifications for various supply voltage levels, for maximum current, standard TTL input levels, temperature range, access and cycle times, etc. Only one of these standard tests is emphasized in the examples below, although it is understood that the concepts of the invention could be employ many other similar test techniques.

The ADSEL test used in the examples below to illustrate the concept of the invention is a sequence of data writes and reads as follows:

1. Write "0" to address A (starting with A=0); increment A; continue until A overflows. This sequence fills all 64K-bits in memory array 10 with a background of zeros. The "address A" is a 16-bit number in a register in the test machine which has its output connected to the address pins 16 in 8-bit time-multiplex as $\overline{RAS}$ and $\overline{CAS}$ are strobed. With a cycle time of 250 ns, this part will require a minimum of 250×64K or 16,384,000 ns, i.e. 16 millisec.
2. Starting at A=0, read the bit at A (which should be "0"), then write a "1" to this bit, then read this bit (which should now be "1"). Next, increment the address A, and repeat the read ("0"), write ("1"), and read ("1") sequence. Continue to increment A and R, W, R up through A=65535, until A overflows. This toggles each bit in turn, and leaves a background of all ones. The two reads for each bit represent two of the test states to be recorded.
3. Again, starting at A=0, read the bit at address A (should be "1" again), then write a "0" to this bit, then read the "0". Increment A and repeat the R, W, R sequence. Continue until A overflows. Again, two reads are two more test states. The array is left in an all zero condition.
4. Now, starting at A=65535, repeat the R, W, R sequence of step 2, but decrement A until underflow, instead of increment. This generates two more reads for the test pattern, but for a different addressing sequence (i.e., decrementing instead of incrementing).
5. Finally starting again at A=65535, repeat the R, W, R sequence of step 3, but decrementing instead of incrementing, until A underflows. The total time on the test machine for steps 2, 3 and 4 and 5 is about 4×3×250×65536 ns or 196 millisec, so the total for one complete pass of the ADSEL algorithm on a given device is about 0.2 sec.

Each individual read operation in the steps 2-5 includes compare with the value that the data bit should be; the read is referred to as a microstate. The foregoing sequence of steps 2-5 tests every bit of the memory using several data sequences (i.e., write 0, read 0, write 1, read 1, read 1, write 0, read 0) for several data background conditions (adjacent bits 1 or 0); then, the data sequences are repeated for a different address sequence (decrement instead of increment). This particular test pattern is widely used in the industry and is referred to as ADSEL, an acronym for address-select. The second read of the same data bit may be omitted (i.e., W, R, W, R instead of W, R, R, W, R, R, W, etc.) when using some commercially available test equipment, and similar results obtained, but the two reads as described above are preferred because it indicates whether toggling adjacent bits will disturb the tested bit, and whether there are read-disturb conditions.

The eight reads in the sequence of steps above include two in step 2 and two in step 3, incrementing, and two each in steps 4 and 5, decrementing. These eight are recorded as a set of pass/fail indicators in the form "PPPFPPF", for example, where P is pass and F is fail. One set may be from a single bit, or from a row, or from a column. These sets can be entered into a data base, identified by address (row, column), and device identity, for search algorithms.

The ADSEL program has been used in production testing, where any failure of any bit, any row, or any column, results in a discard unit. That is, in production it doesn't matter what type or where a failure is detected by the ADSEL program; there are only two conditions—pass or fail. The purpose of the invention, however, is not that of go/no-go production line testing, but instead the purpose is to examine the failed units to discover in detail specifically where and why each one failed. The ADSEL program has also been used with a "bit-scope" or bit-mapped display of the results of the test. Here the face of an oscilloscope shows a map of the cell array, and each failed bit is displayed as a bright spot, so the pattern of failed bits can be seen in their position in the array. This type of display usually shows the cummulative results of all of the tests on a device; that is, instead of showing the eight individual microstates PPPPPFPP as discussed above, the bright dot on the scope indicated a failure in any one or more (or all) of the states.

Certain failure modes within the cell array and the resultant unique sets of pass/fail patterns useful in practice of the invention, can be understood from the structure and electrical circuitry of FIGS. 3, 4 and 5.

For example, if two adjacent capacitors 41 have a short 41a through the substrate 50 as seen in FIG. 4, due to the absence of the intended field oxide 64 at this point, then there would be a failure indicated for two bits, one for corresponding row 42 and column 43, seen in FIGS. 3 or 4. The entire rows or columns would not show failures, because the fault 41a is isolated by the access transistors 40 to the two storage capacitors. The failure pattern in the ADSEL algorithm, i.e., the set of pass/fail indicators for microstates, is as follows for the two affected bits:

PPPPFPFP
FPFPPPPP

These would be in a field of all P's for all surrounding bits. Note that the failure is data-sequence dependent and address-sequence dependent, and that the sets are mirror images. The reason for this behavior can be derived from the circuit and structure. The fault 41a causes both of the two capacitors 41 to be forced to the same data level as the last write. If a 0 is written to one, the other will be forced to 0, even if it had been storing a 1. If a 1 is written to one, the other will be forced to 1. So if a field of all 0's is written (assuming true logic, i.e., the true side of the array), then the first read of one bit will not show a failure, but when the first read of the second bit is reached it will show fail because the first and second bits had a 1 written into them after its first read. Similarly, the second read of the first bit will show a pass because both bits are forced to by the write-1, then the second read of the second bit shows a P because it should be 1 at this point. The third read of the first bit is again a P because it's still 1 and should be, but the third read of the second bit is F because of the write-0 of the first bit just after the third read. The cells show a mirror image in the decrement portions of the algorithm, as is logical.

A unique pattern for a single row is produced when a short between first-level poly strip 56 and second-level poly segment 48 exists, as indicated by a short 56a of FIG. 3. This short produces the effect of tending to pull the metal word line 42 to Vdd because the first-level poly is biased to Vdd; however this word line will be discharged to ground during the precharge cycle, when other rows are being addressed, and, due to the resistance of poly-1 will take much longer than a cycle to charge up to the Vdd level. However, when this row is being repeatedly addressed the row line will charge to Vdd and stay, so it will show failures. The unique set of pass/fail indicators for the entire row using ADSEL is:

FPFPFPFP which is noted to be address-sequence independent; it is the same for incrmenting and decrementing addresses. It shows F on the first read because erroneous data is left in the cells by prior addressing; the second read is P because a 1 has just been written, and it reads correct. But other addresses are applied before the next read, so the third read is an F. The microstates alternate FP because the addresses are changed after each pair. This same FPFPFPFP pattern occurs for other types of defects as discussed below, so the defects are distinguished by whether a single row shows the pattern, or a single bit, or a pair of bits, or a single column, etc.

Another example of a unique pass/fail pattern is caused by the fault 41b in FIG. 3 or 4 from a capacitor 41 to a bit line 43. This should cause this capacitor 41 to always show a 1 (for the true side of the array) because all the bit lines 43 are precharged to Vdd before every active cycle. Thus, regardless of what has been written into this cell, it will always read 1. Thus, failures will be data dependent (no error shows when reading a 1 when that's what it's supposed to be) but address sequence independent (it doesn't matter which direction addressing is proceeding). The pass/fail pattern is FPPFFPPF, all surrounding bits showing all-pass.

An additional example of a unique set of pass/fail indicators which defines a certain fault is that caused by a missing contact 59a. This could be caused by a particle being present on the surface during some part of the photolithographic expose/develop/etch steps for the patterning of metal strips 42, the holes for oxide 63, etc. The result is that the metal row line 42 does not make contact to the polysilicon segment 48 for these two cells. The pass/fail pattern for the false logic half of the array of FIG. 1 is as follows:

FPPFFPPF
FPPFFPPF while a different pattern would result for the true logic half of the array. Note that the pattern is the same for one line as the fault 41b, so the two types of fault are distinguished by the presence of two adjacent bits with the pattern, rather than a single one in a field of all-pass. The reason why the pattern will be the same is that the access transistors 40 will never be turned on and the bits will always appear as zero-voltage, which for the false logic side is a 1, regardless of what should have been written into them.

A further example of a unique set of pass/fail indicators is that associated with a bridge fault 42f between two metal row lines 42 as seen in FIGS. 3 or 4. Assuming the first row has an odd address and the second an even, the pattern for two adjacent rows 42 is as follows:

PPPPFPFP
FPFPPPPP

Note that this set applies to the entire two rows, i.e., every bit in two adjacent rows, and so this pattern is distinct from the same pattern set forth above for a pair of bits caused by the tunnel fault 41a, where the pass-/fail set for two bits was in a field of all-pass.

In a like manner, a failure caused by a bridge-fault 48a shorting from one of the second-level polysilicon segments 48 to another adjacent segment 48 will cause the same pattern of

PPPPFPFP
FPFPPPPP but this will be for rows spaced one address from one another instead of adjacent (in address number). This second-level poly short totally electrically connects two rows to one another just as the metal short did as explained just above, but there is an intervening row not affected in this case.

The pass/fail pattern for a faulty bit in the array half 10a may differ from the pattern for the same fault in a bit in the array half 10b because data is stored true in one half and false or complemented in the other. A logic 1 is a +5 volt level in the storage capacitors 41 of the array half 10a, and a logic 0 is a Vss level; however, in the array half 10b, a logic 1 is at Vss and a logic 0 is +5 v in the storage capacitors. Thus, regardless of whether the row address selects a row in array 10a or array 10b, if a 1 is read the output lines 25 will be at +5 and the lines 26 at zero. Since the failures exhibited in the microstates are data dependent, the pass/fail patterns may differ between the array halves.

A defect in the form of an open bit line 43 indicated by a gap 43a will cause a whole column to fail, because the sense amplifier would be unbalanced and would flip one way every time, exhibiting an ADSEL pattern of

PFFPPFFP for this column in one array half, or the complement of this pattern in the other array half

FPPFFPPF

This defect would be caused by an absence of the source-drain N+ diffusion, e.g. by a particle that covered this bit line area during a photolithographic step.

A defect in the form of a short 43b between two bit lines, seen in FIG. 3, will cause two whole columns to fail, again due to unbalance above but also due to erroneous data. This defect will cause an ADSEL pattern which is the same as above but for two adjacent columns instead of a single column:

PFFPPFFP in one array half and the complement of the defect is in the other half:

FPPFFPPF

A similar pass/fail pattern is produced when a first-level polysilicon line 56 between two bit lines 43 is not connected to Vdd, but in this case the pass/fail pattern will be exhibited for only half columns, i.e., only one array half. The sense amplifier will function to read valid data bits from the column line half opposite from the side having the defect, but on the side with the defect only a zero voltage can be read from the storage capacitors 41 because the inversion layer 55 will not be created. Again, two adjacent half columns in one array half will show:

PFFPPFFP and the complement will be exhibited if the defect is in the other array half:

FPPFFPPF

This defect usually would occur at a metal-to-polysilicon contact where the second-level poly 56 is connected to Vdd, and would be caused by inadequate etch of the oxide layer 63 due to a particle covering this area in the photolith operation.

A failure in the decoder 20, 21 upstream of the node 46 of FIG. 3 will cause four complete columns to fail due to the particular decode and I/O arrangement.

Figure 6:
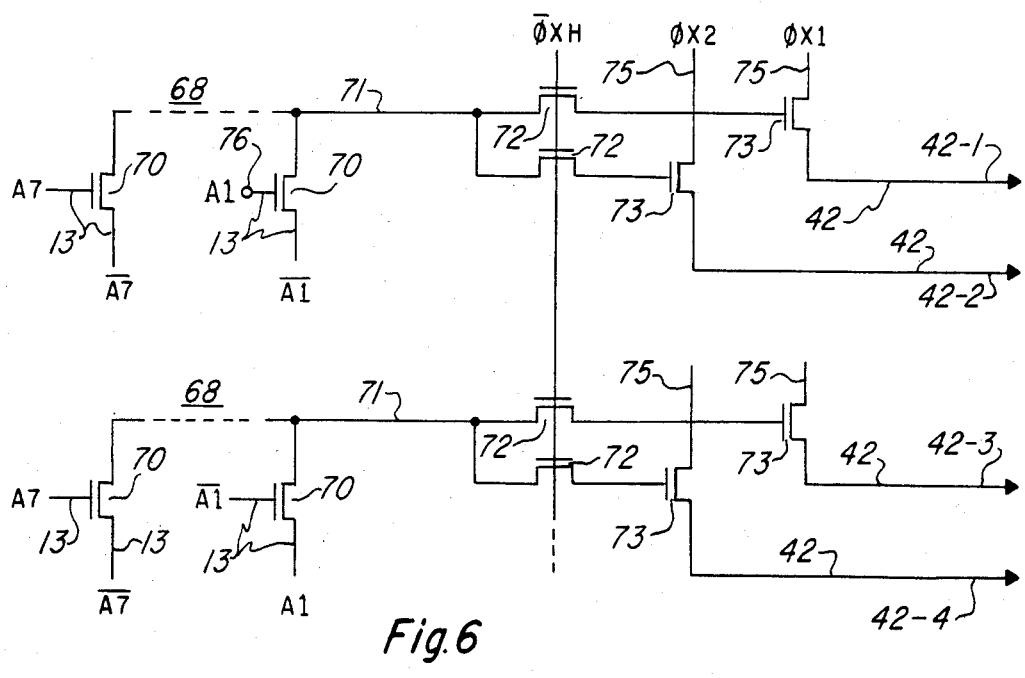
FIG. 6 is an electrical schematic diagram of the row decoder in the device of FIG. 1.

Referring now to FIG. 6, an additional example of a unique pass/fail pattern will be explained in reference to the details of circuitry of the row decoders 12. For each pair of rows 42, the row decoder 12 includes a logic gate 68 as set forth in U.S. Pat. No. 4,330,851, issued to Lionel S. White, assigned to Texas Instruments. Each of these gates 68 includes a set of transistors 70 for each adjacent pair of rows, with the address and address-bar lines 13 uniquely connected to the sources and gates for each pair. A set of seven of these transistors 70 is connected to a precharged node 71 in a gate, and this node is coupled through transistors 72 to the gates of transistors 73 which are in series with the metal row lines 42. All of the transistors 72 for all 256 rows are potentially turned on by a $\phi$XH clock on line 74 occurring after $\overline{RAS}$ falls, but only one node 71 (one-of-128) is selected by the A1-A7 and $\overline{A1}$-$\overline{A7}$ bits of the row address 13, in a given active cycle. The AO address bit causes one-of-two lines 75 to go high, these being referred to as the $\phi$X1 and $\phi$X2 clocks. Thus, only one of the row line 42 (out of 256) will go high, all others staying at ground. The row lines 42 are metal as seen in FIGS. 4 and 5.

One example of a failure in the circuit of FIG. 6 that produces a unique pattern is a missing contact between metal and polysilicon at the gate 76 of the transistor 70 in the NOR gate for one of the row decoder branches, in this example the gate 76 receives the A1 address bit. This causes failures to show up for the entire rows 42-0 and 42-1 which are controlled by this transistor 70, and it will also cause a certain failure to appear for the rows 42-2 and 42-3 which receive the complement bit $\overline{A1}$, because the decoder cannot distinguish between the two addresses which have 1 or 0 for the $\overline{A1}$ bit. This sequence can be understood by noting that hook-up of "extra" cells to the bit line causes no problem when the "extra" cell contains a true 1 (no charge transfer), but an "extra" cell containing a true 0 can hurt a cell containing a true 1. The unique pass/fail pattern observed for the missing contact at gate 76 is

PPPPFPFP
PPPPFPFP
PPFPPPPP
PPFPPPPP for the entire four rows 42-1 to 42-4. That is, all bits on these four rows show this same pattern when addressed.

Another similar algorithm which may be used to initially screen the devices, before running ADSEL, is referred to in the industry as ZERON, which stands for "zero-one". This algorithm when run on the device of FIG. 1 first writes zeros in all 64K bits, then reads zeros from all bits, then writes ones in all bits, followed by reading ones from all bits. This test then merely checks to see if a 0 and 1 can be written into and read out of each bit.

Additional information can be produced by running other standard tests. For example, there are checkerboard, diagonal, walking ones and zeros, and various other tests available. Each of these can produce microstate pass/fail data such as the PPFPPPFPP notation above. The number of microstates depends upon the number of "reads" in the algorithm, for a given bit, row or column.

The ZERON and other test patterns can be used to further distinguish between similar ADSEL pass/fail sets. One of these others is called "PAGE"; the PAGE test consists of first writing a background of 1's (0's) to the entire array, then applying a certain row address and holding $\overline{RAS}$ down while toggling $\overline{CAS}$ to read the bits in this row as column addresses are changed. The memory device is then operating in the so-called page mode, which is part of the typical specification. Another of the test patterns is referred to as micro-PAGE or $\mu$PAGE, and is the same as PAGE except that instead of merely reading each bit, there is a read, write, read done at each bit address (like in ADSEL) before changing the column address.

Some failures are time and voltage dependent. For example, a leakage path through the silicon beneath field oxide 64 between two capacitors 41 at the point 41a of FIGS. 3 and 4 may be of high resistance instead of the low resistance short as discussed above, so that an error does not occur for a considerable time period and then only for certain data conditions. That is, obviously, a 1 level will not decay to the adjacent capacitor if the adjacent capacitor also has a 1. To detect this type of failure, there are so-called disturb or hammer algorithms. Here, for example, zeros will be written to a certain cell or checkerboard pattern of cells, then ones repeatedly written to all adjacent surrounding cells for a long period of time, approaching the specified refresh time of 4 ms. This repeated charging of adjacent capacitors will thus uncover some of these types of failures. The algorithm may repeat for a different address pattern and/or inverse data. Again, pass/fail microstates could be recorded for certain cells, rows, or columns for devices where such failures have been detected.

A manufacturing procedure employing the invention would then utilize a number of test algorithms instead of only the ADSEL algorithm discussed above. The bulk of the production in a given day would pass all tests—perhaps 70 or 80%, more or less—would show no failures for any test, in a mature product which had been in full-scale high volume production for a substantial time. Of the 20 or 30% that fail some test, a substantial fraction would be failing a time or voltage parameter that is unrelated to the identified faults discussed above; for example, devices failing for low Vt, leakage on input pin, etc., would not be subjected to the scanning of this invention. Others might have multiple failures, or large blocks of failed bits, where the patterns were too complex for analysis. The remaining devices showing a failure of no more than a small number, e.g. four adjacent, bits, rows or columns, might be selected for the full screening sequence of the invention. For a production level of several hundred or a thousand slices a day (each slice having two or three hundred chips), this might result in only a few slices (and not all devices on each slice) per day to receive the entire sequence of testing, recording of microstates, and correlation, according to the invention. So, the selected slices would be subjected to the ZERON and ADSEL tests for screening, then the memory devices with the proper pattern of failed bits subjected to more specific ADSEL tests and the other tests which were wanted, and all the data stored. The data base of pass/fail microstate sets for that day would then be subjected to search and sort algorithms to determine the prevalence of, for example, metal shorts, second poly to second poly shorts, moat shorts, etc., and the information about problem areas immediately fed back to the manufacturing facility for action. The time period that a problem remains uncorrected is thus vastly shortened, and the amount of highly skilled work greatly reduced, compared to visual inspection under microscope; also the number of failure mechanisms which is detectable is greatly increased.

In the memory device of FIG. 1, faults can occur in circuitry other than the memory array 10a and 10b which has been discussed above. That is, metal shorts or polysilicon shorts can occur in the buffers 14 and 19, the sense amplifiers 11, the clock generator circuitry 37, etc. These types of faults are not treated in this description. However, the majority of the area of the chip is in the array 10a, 10b. If a given fault type is occurring, the probability of it occurring in the cell array is high, due to the ratio of cell array area to the peripheral area. Also, the method of the invention is mostly concerned with distribution of types of faults, rather than single occurances, and comparisons of distributions on a given day with prior data. So, it is of little concern that fault identification for peripheral circuitry on the chip is not treated by the method of the invention.

A feature of the present invention is that the relationship of the test matrix pattern and the specific defect is proven, rather than accidental. Thus in the prior art testing of memory devices it has sometimes been noted that a string of adjacent defective bits is associated with aluminum bridging, but that was because the time, temperature, or material operation, for example, in a particular step of manufacturing operation had ben off-spec and less complete aluminum etching was being implemented than was intended. Once the manufacturing operation is brought back to specifications, adjacent bit defects begin to take on a different meaning. The test matrix patterns of the present invention, in contrast to the foregoing prior art bit failure observation, isolates a specific failure mechanism by recording a lot more data, i.e., microstate data.

For manipulative reasons it is easier to apply the test signal sequence to the memory devices while they are still on a wafer or slice before they are broken up into separate chips. Standard wafer testers can then step their test probes through all the memory devices on the wafer. If desired, however, the testing of the present invention can be performed on the separated chip, after packaging. Such testing is very late in the production and can accordingly pick up flaws caused by defective chip separation or packaging. However if the chip separation or packaging takes place a substantial time after the wafer completion, the wafer production facility will have been permitted to run under defective conditions that much longer.

The testing of the present invention can also be used with integrated circuits that are not memory devices. The test signal sequence is then modified, preferably to duplicate the use of the integrated circuit under extreme conditions. Thus a counter can be tested with test counting pulses of high and low voltages, short and long durations, and closely and widely spaced. Gates and other logic items are similarly tested. However memory devices have more regularly spaced components and are produced in higher volume, so that the greatest significance of the present invention is in the testing of memory devices, particularly those having 64K or more memory bits.

Obviously many modifications and variations of the present invention are possible in light of the above teachings. It is therefore to be understood that within the scope of the appended claims the invention may be practiced otherwise than as specifically described.

What is claimed is:

1. In the method of manufacturing integrated circuits that may sporadically contain manufacturing defects not detectable visually or requiring excessively long visual inspection to detect, the improvement comprising the steps of: applying an electrical test sequence to a large number of said integrated circuits to generate a proven data base containing the responses caused by specific manufacturing defects to said electrical test sequence, said sequence including a plurality of tests of electrical characteristics of said integrated circuits, said responses being multiple-bit digital indicators of results of said tests, applying said electrical test sequence to a second group of manufactured integrated circuits to obtain a second response corresponding to said responses and when said second response is obtained indicating a defect in an integrated circuit of said second group, comparing said second response to said proven data base to specifically identify the defect.

2. The method of claim 1 in which the integrated circuit is a memory device having an array of rows and columns of memory cells.

3. The method of claim 2 in which the electrical test sequence is applied to one memory cell while at least one adjacent while at least one adjacent memory cell has a stored charge.

4. The method of claim 2 in which the electrical test sequence applies a sequence of different electrical conditions to the integrated circuit, and the data base contains a collection of responses to these different electrical conditions.

5. The combination of claim 4 in which the different electrical conditions span a plurality of significant operating sequences for the integrated circuits.

6. The method of claim 5 in which the integrated circuit is in the form of a wafer containing a large number of embodiments of that circuit in a regular repeating pattern.

7. A method of determining the specific cause of failure of a semiconductor read/write memory device; said memory device having an array of rows and columns of memory cells, and having addressing circuitry and data input/output circuitry, all on a semiconductor chip, said chip having address terminals for applying address bits to said addressing circuitry and data terminal means for applying data to and receiving data from said data input/output circuitry, said method comprising the steps of:

applying a first selected sequence of addresses to said address terminals of the memory device while applying a first sequence of data bits to said data terminal means to write into the memory cells a first selected pattern of data, and detecting the data on said data terminal means which is read from said memory cells for said first sequence of addresses; and comparing said detected data with said first sequence of data bits for a given part of said array to produce a first set of pass/fail indicators;

applying a second selected sequence of addresses to said address terminals of said memory device while applying a second sequence of data bits, different from said first sequence of data bits, to said data terminal means to write into the memory cells a second selected pattern of data, and detecting the data on said data terminal means which is read from said memory cells for said second sequence of addresses; and comparing said detected data with said second sequence of data bits for said given part of said array to produce a second set of pass/fail indicators;

comparing said first and second set of pass/fail indicators with a plurality of different known series of pass/fail indicators, said known sets being proven to correspond to specific fault conditions, to detect when if any of said plurality of known sets match said first and second series.

8. A method according to claim 7 wherein said second selected sequence of addresses is the same as said first selected sequence of addresses.

9. A method according to claim 7 said first series of pass/fail indicators is associated with one of said rows and said second series of pass/fail indicators is associated with another row adjacent said one row.

10. A method of testing a semiconductor device of the type having a regular array of rows and colums of elements, and having means for addressing said elements for data input and output individually by addresses applied to said device, said method comprising the steps of:

(a) applying a sequence of electrical tests to a large number of said semiconductor devices using said means for addressing said elements for data input and output, and producing test results, and based upon said test results selecting from said large number a smaller group of said devices, said smaller group having produced test results to reveal faults in a small number of said elements or a small number of rows or columns of said elements;

(b) applying to each device of said smaller group an electrical test sequence using said means for addressing said elements for data input and output, said electrical test sequence including a plurality of different data input and output patterns for a plurality of different addressing patterns, said electrical test sequence producing pass/fail test results for each data and addressing pattern for each said element having a revealed fault and for each element in the immediate vicinity of said element having a revealed fault:

(c) comparing said pass/fail test results for all of said small group with a data base of known patterns of pass/fail test results correlated with known manufacturing defects to thereby identify the manufacturing defects prevalent in said small group.

11. A method according to claim 10 wherein said devices are read/write memory devices.

12. A method according to claim 11 wherein said plurality of different data input and output patterns includes writing ones over zeros and reading the ones, then writing zeros over ones and reading the zeros.

13. A method according to claim 12 wherein said plurality of different addressing patterns includes addressing all of said elements in ascending order of said addresses, and again in descending order of said addresses.

14. A method of determining the causes of failures of semiconductor devices which are known to have fault areas, said areas of the semiconductor devices having cells into which data is written and from which data is read, comprising the steps of:

subjecting each of said devices to a plurality of different sequences of electrical tests which have different patterns of data 1's and 0's written into said cells at a plurality of different patterns of addresses to produce a plurality of sets of pass/fail indicators for each device for a selected one of said fault areas; said pass/fail indicators being the results of said sequences of electrical tests;

comparing said plurality of sets of pass/fail indicators for said selected one of said fault areas for each said device to a catalog of sets of pass/fail indicators which are known to define unique failure causes, to determine matches.

15. A method according to claim 14 wherein said devices are read/write memory devices.

16. A method according to claim 15 wherein said read/write memory devices include arrays of rows and columns of memory cells.

17. A method according to claim 16 wherein each of said fault areas is a single bit, row or column of cells, or a small number of bits, rows or columns, surrounded by a large number of cells having no faults.

18. A method according to claim 16 wherein said devices include means for addressing said arrays, and wherein said plurality of different patterns of addresses is applied to said addressing means in both ascending and descending order of addresses.

19. A method according to claim 18 wherein said pass/fail indicators include multi-bit digital representations of results of said sequences of electrical tests.

20. In a method for testing a digital storage device, said device having a plurality of addressable storage locations, the combination of testing steps to determine if all addressable storage locations of said device function as desired, with analyzing steps to be performed on said device if an addressable storage location of said device fails to so function, in order to determine the physical cause for the failure of said location to so function, said analyzing steps comprising:

energizing a failing addressable storage location with a predetermined sequence of electrical stimuli;

recording the response of said failing addressable storage location to certain stimuli in said sequence;

comparing the recorded responses to a set of known responses to said sequence of stimuli corresponding to similar digital storage devices having addressable storage locations failing to function as desired due to known physical causes, so that, if the recorded responses correlate to any of said known responses, the physical cause for the failure of said addressable location to so function is determined.

21. The combination of claim 20, wherein the energizing step further comprises energizing addressable storage locations other than said failing addressable storage location with a predetermined sequence of electrical stimuli.

22. The combination of claim 20, wherein the addressable memory locations of said digital storage device have a topological relationship to one another, and wherein a plurality of addressable storage locations fail to function as desired, further comprising:

determining the addresses of a plurality of failing addressable storage locations; and evaluating, from said addresses of said failing addressable storage locations, the topological relationship of said failing addressable storage locations;

and wherein said comparing step further comprises comparing the topological relationship of said failing addressable storage locations to the topological relationship of said addressable storage locations of said similar digital storage devices failing to function as desired due to known physical causes.

23. The combination of claim 22, wherein the sequence of electrical stimuli is determined by said topological relationship of said failing addressable storage locations.

24. The combination of claim 20, wherein the sequence of electrical stimuli comprises a predetermined sequence of read and write operations of digital data.

* * * * *

UNITED STATES PATENT AND TRADEMARK OFFICE
CERTIFICATE OF CORRECTION

PATENT NO. : 4,642,784

DATED : February 10, 1987

INVENTOR(S) : Lionel S. White, Jr; Maury Zivitz

It is certified that error appears in the above-identified patent and that said Letters Patent is hereby corrected as shown below:

Claim 3, line 3: After "adjacent" first occurrence, delete "while at least one adjacent".

Signed and Sealed this

Eleventh Day of July, 1989

Attest:

DONALD J. QUIGG

Attesting Officer

Commissioner of Patents and Trademarks